(12) United States Patent
Sakai et al.

(10) Patent No.: US 6,494,096 B2
(45) Date of Patent: Dec. 17, 2002

(54) SEMICONDUCTOR PHYSICAL QUANTITY SENSOR

(75) Inventors: Minekazu Sakai, Kariya (JP); Minoru Murata, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/801,917

(22) Filed: Mar. 9, 2001

(65) Prior Publication Data

US 2001/0025530 A1 Oct. 4, 2001

(30) Foreign Application Priority Data

Mar. 16, 2000 (JP) ........................................ 2000-079352
Dec. 15, 2000 (JP) ........................................ 2000-382422

(51) Int. Cl.⁷ .......................................... G01P 15/125
(52) U.S. Cl. .................................................... 73/514.32
(58) Field of Search ........................ 73/514.32, 504.02, 73/504.03

(56) References Cited

U.S. PATENT DOCUMENTS

| 5,542,295 A | 8/1996 | Howe et al. |
| 6,065,341 A | 5/2000 | Ishio et al. |
| 6,105,428 A | * 8/2000 | Schmiesing et al. ...... 73/514.32 |
| 6,151,966 A | 11/2000 | Sakai et al. |

FOREIGN PATENT DOCUMENTS

| JP | 4-337468 | 11/1992 |
| JP | 11-344507 | 12/1999 |

* cited by examiner

Primary Examiner—Richard A. Moller
(74) Attorney, Agent, or Firm—Law Offices of David G. Posz

(57) ABSTRACT

A semiconductor acceleration sensor, which prevents an adhesion of a movable electrode to a first or second fixed electrode due to an electrostatic attracting force generated therebetween. The sensor has a weight portion and movable electrodes formed on both sides of which, and first and second fixed electrodes each engaging with the each of the movable electrodes. Each of the first and second fixed electrodes is disposed in parallel with each of the movable electrodes so that side faces thereof determine a detection interval and non-detection interval larger than the detection interval with side faces of adjoining two of the movable electrodes. Protrusions are formed on both of the side faces of each of the first and second fixed electrodes. These protrusions prevent the movable electrodes from adhering to the first or second fixed electrode in both of the detection interval and non-detection interval.

17 Claims, 9 Drawing Sheets

SEMICONDUCTOR PHYSICAL QUANTITY SENSOR

CROSS REFERENCE TO RELATED APPLICATIONS

This application is based upon Japanese Patent Application Nos. 2000-79352 filed on Mar. 16, 2000, and 2000-382422 filed on Dec. 15, 2000, the contents of which are incorporated herein by reference.

BACKGROUND OF THE INVENTION

1. Field of the Invention

This invention relates to semiconductor physical quantity sensors for detecting a physical quantity such as acceleration or angular velocity, especially, to a capacitance-detecting type semiconductor physical quantity sensor.

2. Related Arts

A structure of a differential capacitance type semiconductor acceleration sensor of a prior art is shown in FIG. 1. A semiconductor layer of a supporting substrate 110 has a moving portion 201 and a fixed portion 301 separated from the moving portion 201 by a trench 140 formed by etching.

The moving portion 201 has suspension parts 202 fixed to the supporting substrate 110, a weight portion 210 supported by the suspension parts 202, and two sets of plural movable electrode members 240 connected to both sides of the weight portion 210.

The fixed portion 301 has plural first fixed electrode members 310 and plural second fixed electrode members 320. Each of the fixed electrode members 310, 320 is engaging with each set of the movable electrode members 240. Each of the movable electrode members 240 and the fixed electrode members 310, 320 has a detection surface and a non-detection surface opposite to each other. The detection surface of each movable electrode member 240 confronts the detection surface of each fixed electrode member 310 at one side with a detection interval 400 interposed therebetween to make a first capacitance. The non-detection surface of each movable electrode member 240 confronts the non-detection surface of each fixed electrode member 310 at the opposite side with a non-detection interval 410 interposed therebetween. The detection interval 400 and the non-detection interval 410 are defined between movable electrode members 240 and the fixed electrode members 320 at the right side of the weight portion 210 similarly to the left side. A second capacitance is formed by the detection surface of each movable electrode member 240 and the detection surface of each fixed electrode member 320.

When a physical quantity is applied to the sensor shown in FIG. 1, the weight portion 210 displaces in a displacement direction Y, whereby the detection intervals 40 change, for example, when the first capacitances increase, the second capacitances decrease, and vice versa. As a result, a differential capacitance between the first capacitance and the second capacitance changes by the applied physical quantity. The applied physical quantity is detected based on a change of the differential capacitance. Conventionally, the differential capacitance is detected as a voltage.

However, when an excessively large physical quantity is applied to the sensor, at least one of the movable electrode members 240 hits to at least one of the fixed electrode members 310 and 320, then adhesion (sticking) occurs between at least one of the movable electrode members 240 and at least one of the fixed electrode members 310 and 320 due to an electrostatic attracting force. Consequently, the sensor doesn't work normally.

For the purpose to prevent the adhesion of the electrode members, protrusions are formed on the detection surface of at least one of the movable electrode member 240 and the fixed electrode members 310, 320. They reduce the electrostatic attracting force significantly. These protrusions are disclosed in JP-A-4-337468, 6-213924, 6-347474, 11-230985, 11-326365 and U.S. Pat. No. 5,542,295.

However, the protrusions in the prior arts don't work sufficiently due to the following reason.

As mentioned above, a change of the detection interval 400 between the movable electrode member 240 and the fixed electrode member 310 is opposite to that of the detection interval 400 between the movable electrode member 240 and the fixed electrode member 320. As a result, the direction of the electrostatic attracting force applied to the movable electrode member 240 on the right side of the weight portion 210 is opposite to that of the electrostatic attracting force applied to the movable electrode member 240 on the left side of the weight portion 210. This structure is referred to as a non-symmetrical structure in this application.

For example, in FIG. 1, the movable electrode members 240 on the left side of the axis Y1 are attracted to an upper side of FIG. 1. To the contrary, the movable electrode members 24 on the right side of the axis Y1 are attracted to a lower side of FIG. 1. In addition, a spring restoring force caused by the suspension parts 202 works to restore the movable electrode members 240 to the initial positions against the electrostatic attracting force on each side. As a result, the weight portion 210 vibrates in a direction of the axis Y1 and rotates easily in directions indicated by curved arrows R as shown in FIG. 1.

It may occur that the movable electrode members 240 and the fixed electrode members 310 or the movable electrode members 240 and the fixed electrode members 320 adhere each other in the non-detection interval 410 when the excessively large physical quantity is applied to the sensor, although the non-detection interval 410 is larger than the detection interval 400.

SUMMARY OF THE INVENTION

This invention has been conceived in view of the background as described above and an object of the invention is to prevent an adhesion of a movable electrode to a fixed electrode due to an electrostatic attracting force even in a non-detection interval interposed therebetween when the non-detection interval is larger than a detection interval interposed between the movable electrode and an opposite fixed electrode.

According to the present invention, the sensor has a supporting substrate, a movable portion separated from a fixed portion by a trench. The movable portion has a weight portion, and movable electrodes formed on both sides of the weight portion in a displacement direction, and the movable portion is suspended above the supporting substrate. The fixed portion has first and second fixed electrodes each engaging with each of the movable electrodes for forming capacitors.

Each of the first and second fixed electrode is disposed in parallel with the movable electrodes so that the side faces thereof determine specific intervals, a detection interval and a non-detection interval larger than the detection interval, with the side faces of adjoining two of the movable electrodes. Protrusions are formed, for example, on both side faces of the first fixed electrode opposing to the side faces of the adjoining two of the movable electrodes.

According to the present invention, these protrusions prevent the adjoining two of the movable electrodes from adhering to the first fixed electrode at both of the side faces of the first fixed electrode when an excessively large physical quantity is applied to the sensor. The protrusions may be formed on the side faces of the movable electrodes facing the side faces of the first fixed electrode.

Preferably, the protrusions on the both side faces of the first fixed electrode are formed in the same size and the same shape. It may allow stable forming of the protrusions. More preferably, the protrusions on the both sides are disposed symmetrically with respect to a longitudinal direction of the first fixed electrode.

BRIEF DESCRIPTION OF THE DRAWINGS

Other objects, features and advantages of the present invention will become more apparent from the following detailed description made with reference to the accompanying drawings. In the drawings.

DESCRIPTION OF THE EMBODIMENTS

Figure 1:
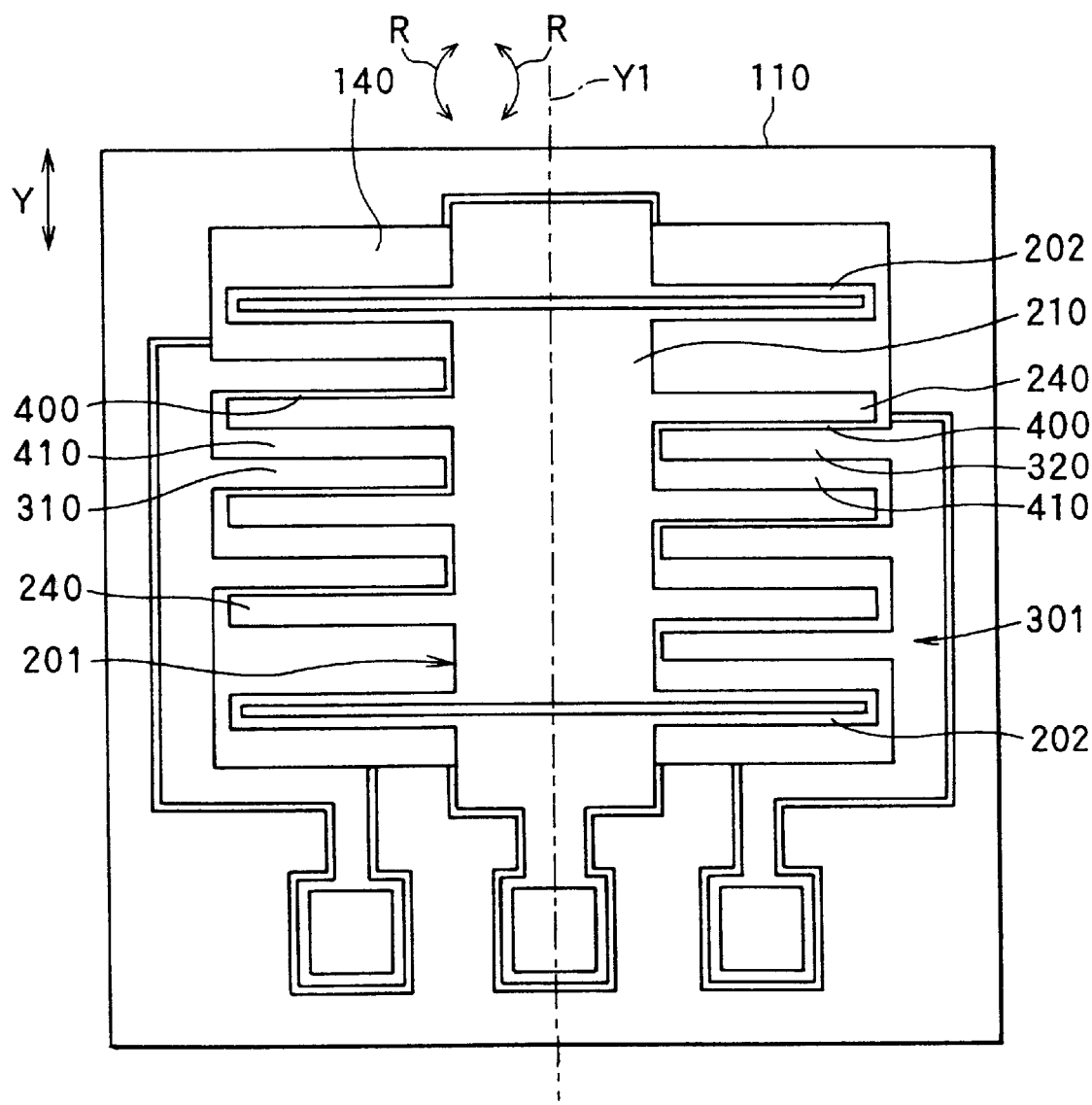
FIG. 1 is a schematic plan view showing a semiconductor acceleration sensor of a prior art.

Specific embodiments of the present invention will now be described hereinafter with reference to the accompanying drawings in which the same or similar component parts are designated by the same or similar reference numerals.

These embodiments will describe differential capacitance type semiconductor sensors as electrostatic capacitance type physical quantity semiconductor sensors which can be used as an acceleration sensor that operates an air bag system or an anti-locked break system, or as an angular velocity sensor for a vehicle stability control system, a vehicle navigation system and the like.

(First Embodiment)

Figure 2:
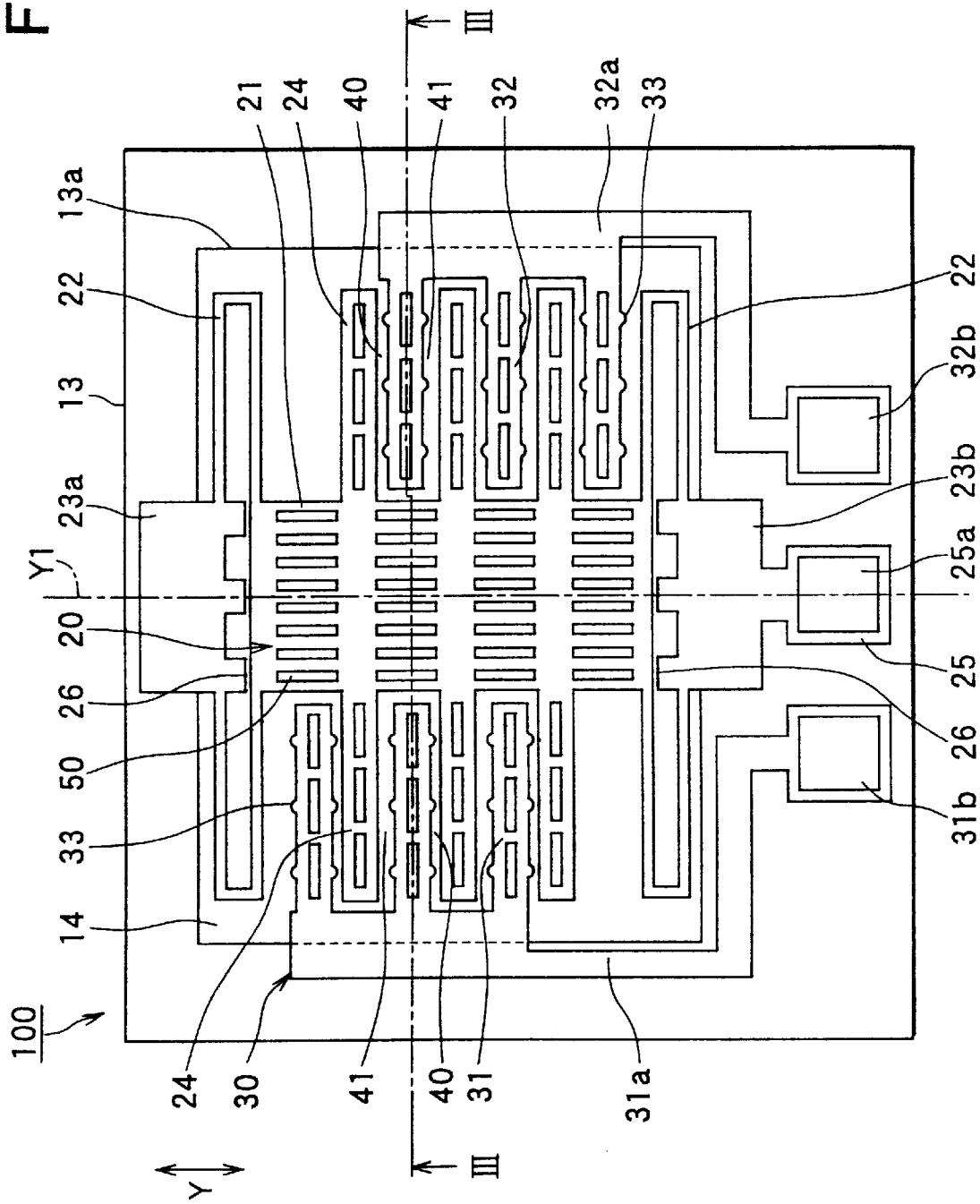
FIG. 2 is a schematic plan view of a semiconductor acceleration sensor of a first embodiment of the present invention.
Figure 3:
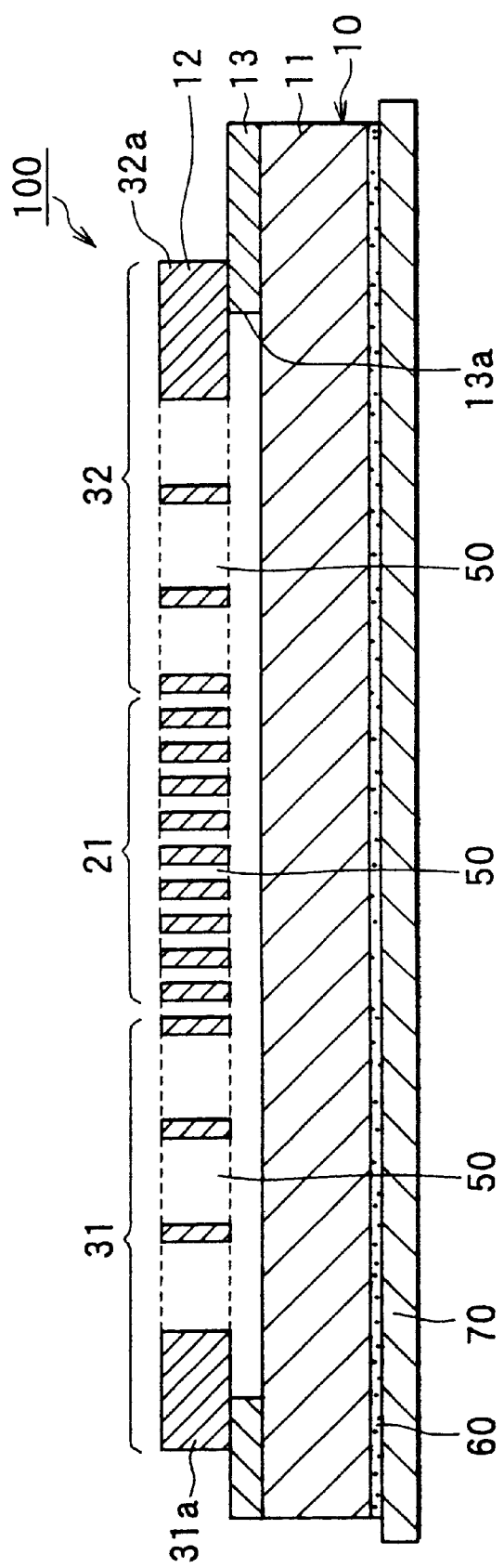
FIG. 3 is a sectional view taken along line III—III in FIG. 1.

Referring to FIGS. 2 and 3, a semiconductor acceleration sensor 100 (which is simply referred to as a sensor 100 hereinafter) is formed as a rectangular sensor chip in a semiconductor substrate by a well-known micro-machined method. As shown in FIG. 3, the semiconductor substrate forming the sensor 100 is a SOI (Silicon On Insulator) substrate 10 which includes a first silicon substrate (supporting substrate) 11 as a first semiconductor layer, a second silicon substrate 12 as a second semiconductor layer, and an oxide layer 13 as a insulator layer interposed between the first silicon substrate 11 and the second silicon substrate 12.

A beam structure consisting of a movable portion 20 and fixed portion 30 is formed in the second silicon substrate 12. The movable portion 20 is separated from the fixed portion 30 by forming trenches 14. A part of the oxide layer 13 is removed under the beam structure by sacrificial layer etching to make a rectangular opening 13a as shown in FIGS. 2 and 3. The fixed portion 30 is supported by the first silicon substrate 11 through the oxide layer 13 at a peripheral portion of the opening 13a.

The movable portion 20 has a structure in which both sides of a rectangular weight portion 21 are connected to anchor portions 23a, 23b integrally through suspension portions formed by suspension member 22. The anchor portions 23a, 23b are disposed on a peripheral portion of the opening 13a and fixed to the first silicon substrate 11 through the oxide layer 13. Therefore, the rectangular weight portion 21 of the moving portion 20 is disposed above the opening 13a. The suspension portions are also disposed above the opening 13a.

A pair of suspension members 22 is connected to the anchor portion 23a at one end and connected to the weight portion 21 at the other end. Similarly, another pair of the suspension members 22 is disposed between the anchor portion 23b and the weight portion 21. Each pair of the suspension members 22 is formed as the rectangular frame. Due to this frame shape, the suspension members 22 work as springs displaceable in a direction perpendicular to a longitudinal direction of the suspension members 22 in the sensor 100.

Each of the suspension members 22 is composed of a beam segment (bending member) folded back and having resilient folds. Each of the suspension members 22 has a spring function based on bending of the beam segment and the resilient fold. The suspension members 22 enable the weight portion 21 to move in a displacement direction Y when an acceleration including arrow Y-direction component is applied to the weight portion 21, and to return to the initial position in accordance with disappearance of acceleration as shown in FIG. 2. The weight portion 21 is movable above the opening 13a of the oxide layer 13 in accordance with the acceleration, and is movable in parallel to a main surface of the SOI substrate 10 in this manner.

An axis parallel to the displacement direction Y is referred to as an axis Y1 indicated as a one-dot chain line in FIG. 2. Both side surfaces (right and left side surfaces in FIG. 2) of the weight portion 21 centering the axis Y1 have comb-shaped movable electrodes 24, respectively. The movable electrodes 24 protrude from the side surfaces in directions opposite to each other and perpendicular to the axis Y1 so that each movable electrode 24 is cantilevered with the weight portion 21.

In FIG. 2, each number of the movable electrodes 24 on the right and left sides is three. Each of the movable electrodes 24 is formed in beam structure, a section of which is a rectangular shape, and disposed above the opening 13a. Namely, the movable electrodes 24 are movable along the axis Y1 because the movable electrodes 24 are integrally formed with the weight portion 21.

The fixed portion 30 has comb-shaped fixed electrodes 31, 32 that are opposed to each other with the weight portion 21 interposed therebetween and are respectively engaged with the comb-teeth movable electrodes 24 at the right and left sides of the weight portion 21. The fixed electrodes 31 positioned at the right side in FIG. 2 are referred to as a first fixed electrode 31, while the fixed electrodes 32 positioned at the left sides of the weight portion 21 are referred to as a second fixed electrode 32. The fixed electrodes 31 and 32 are cantilevered with conductive members 31a, 32a so as to project to the weight portion 21 interposed between them.

The first fixed electrode 31 and the second fixed electrode 32 are electrically independent of each other. Each of the fixed electrodes 31, 32 has several (three in the figure) electrode members, and is cantilevered with a conductive member 31 or 32 so as to face the opening 13a.

Each electrode member of the fixed electrodes 31, 32 is disposed in parallel with the movable electrodes 24 so that the side faces thereof determine specific intervals with the side faces of adjoining two of the movable electrodes 24. Incidentally, in the semiconductor physical quantity sensor in which the comb-shaped movable electrodes 24 engage with the comb-shaped fixed electrodes 31, 32, almost all the electrode members of the fixed electrodes 31, 32 (that is, the electrode members except the right side uppermost one and the left side lowermost one in FIG. 2) respectively have two side faces (movable electrode opposing faces) that face the movable electrodes 24.

In the specific intervals between the fixed electrode member and the adjoining two of the movable electrodes 24, the narrower one is a detection interval 40 that contributes to detect a change of a capacitance between the movable electrode 24 and fixed electrodes 31, 32, and the broader one at an opposite side of the detection interval 40 is a non-detection interval 41 that does not contribute to detect the change of the capacitance so much.

As shown in FIG. 2, at the left side of the weight portion 21, the detection interval 40 is provided with an upper side face of each movable electrode 24 and a lower side face of each fixed electrode 31, while in the right side of the weight portion 21, the detection interval 40 is provided with a lower side face of each movable electrode 24 and an upper side face of each fixed electrode 32. Thus, a position of the detection interval 40 on the left side of the weight portion 21 is offset from a position of the detection interval 40 on the right side of the weight portion 21 in a direction corresponding to the axis Y1.

Therefore, the sensor 100 shown in FIG. 2 is referred to as the non-symmetrical structure such as the sensor in the prior art. When the sensor 100 operates, voltage potential difference is generated between each movable electrode 24 and each fixed electrode 31, 32. In this state, on the left side of the weight portion 21, an electrostatic attracting force generated between the movable electrodes 24 and the fixed electrodes 31 urges the movable electrodes 24 to an upper side in FIG. 2, and on the right side of the weight portion 21, an electrostatic attracting force generated between the movable electrodes 24 and the fixed electrodes 32 urges the movable electrodes 24 to a lower side in FIG. 2.

Incidentally, in the sensor 100 in FIG. 2, both of the movable electrode opposing faces of each electrode member of the fixed electrode 31, 32 has protrusions 33 protruding to each the movable electrodes 24 to prevent the movable electrode 24 from adhering to the fixed electrode 31 or the fixed electrode 32.

Figure 4:
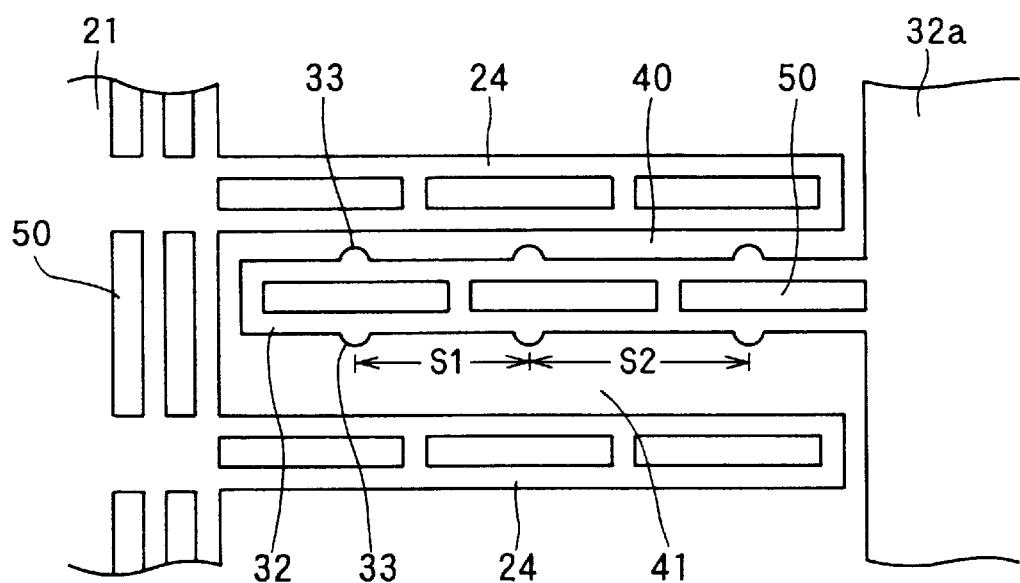
FIG. 4 is an enlarged plan view showing electrode members.

FIG. 4 shows an enlargement figure of the movable electrodes 24, the electrode member of the fixed electrode 32 and the protrusions 33 formed on both of the movable electrode opposing faces of the fixed electrode 32. The protrusions 33 formed on the side face of the fixed electrode 31 are approximately the same as the protrusions 33 formed on the side face of the fixed electrode 32 in size and shape. Tree protrusions 33 are arranged on each of the movable electrode opposing faces of the fixed electrode member 32 and formed to have the same size and the same shape. The tree protrusions 33 are disposed on both of the movable electrode opposing side faces with predetermined intervals S1 and S2 between each other along a longitudinal direction of the fixed electrode 32. The protrusions 33 are disposed symmetrically with respect to the longitudinal direction of the fixed electrode member 32.

For example, a height of the protrusions 33 is 0.75 μm and above in a condition that a length of the movable electrode 24 and the fixed electrode 31, 32 is 300 μm, an interval of the detection interval 40 is 2.5 μm, and the non-detection interval 41 is 9 μm. Both of intervals of S1 (tip portion interval) and S2 (root portion interval) are about 100 μm.

The height of the protrusions 31 is regulated so that spring restoring forces of the suspension members 22 is stronger than an electrostatic attracting force generated between the movable electrode 24 and the fixed electrode 31 or 32 when the protrusions 33 touch the one side of the movable electrode member 24.

The electrostatic attracting force Fe generated between the movable electrode member 24 and the fixed electrode member 31 or 32, and the spring restoring force Fk of the suspension members 22 are represented by the following equations.

$$Fe = å \cdot S \cdot V^2 / 2 / (do - X)$$

$$Fk = K \cdot X$$

Where å stands for a dielectric constant in a vacuum, S stands for an area of a part of a side face of the movable electrode 24 facing the movable electrode opposing face of the fixed electrode 31 or 32 (e.g., $5.0 \times 10^{-8}$ m$^2$), V stands for a voltage difference between the movable electrode 24 and the fixed electrode 31, or 32 (e.g., 5 V), do stands for an initial interval of the detection interval 40 when acceleration is not applied, i.e., when the weight portion 21 doesn't move (e.g., $2.5 \times 10^{-6}$ m), X stands for an amount of a displacement of the movable electrode 24, i.e., an amount of a displacement of the suspension members 22, K stands for spring constant in a direction of a displacement of the suspension members 22 (e.g., 5.0 N/m).

Figure 5:
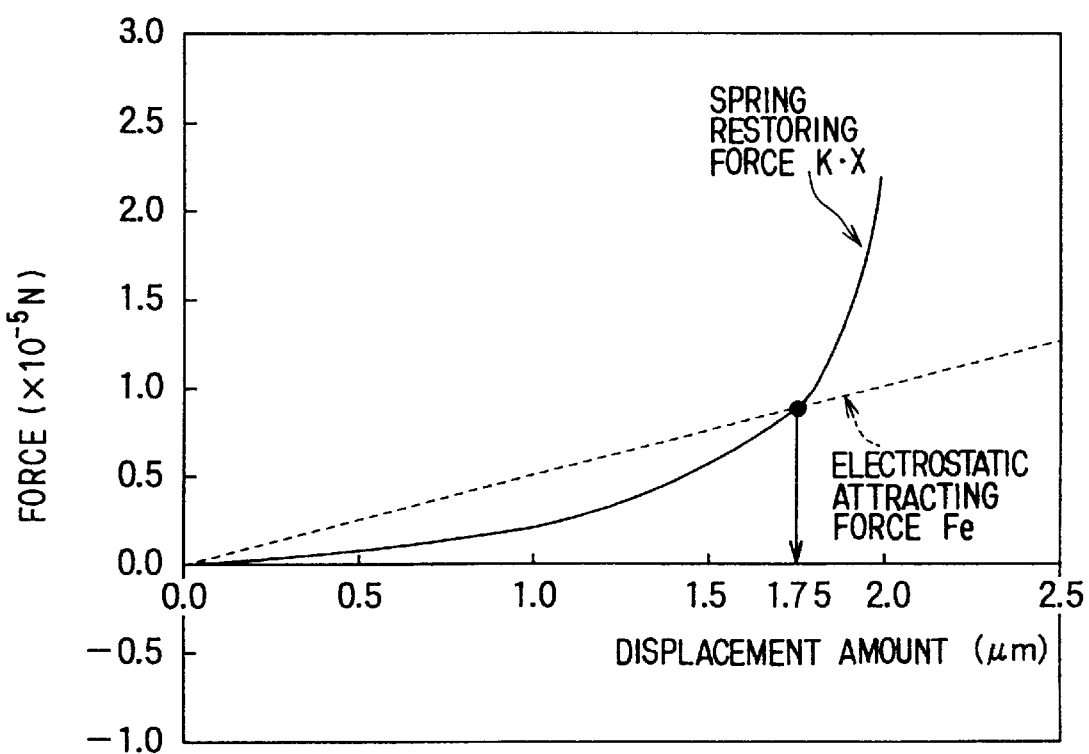
FIG. 5 is a graph showing relationships among spring restoring force K•X of suspension portion, electrostatic attracting force Fe between a movable electrode member and a fixed electrode member, and displacement amount of the movable electrode member in the acceleration sensor of the first embodiment.

Relationships among the electrostatic attracting force Fe, the spring restoring force Fk using numerical values in the brackets described above, and a displacement amount of the movable electrode member 24 are shown in a graph in FIG. 5. In the graph, x axis shows the displacement amount of the movable electrode, and Y axis shows a magnitude of the electrostatic attracting force Fe and the spring restoring force Fk. The displacement amount of the movable electrode 24 equal to 0 μm indicates that the detection interval 40 has an initial value, and the displacement amount of the movable electrode 24 equal to 2.5 µm indicates that the detection interval 40 is zero.

It is understood from FIG. 5 that Fe becomes smaller then K·X when the displacement amount of the movable electrode 24 is 1.75 µm or more, i.e., when the interval of the detection interval 40 is less than 0.75 µm. Therefore, the height of the protrusions 33 is 0.75 µm or more so that the detection interval 40 doesn't become less than 0.75 µm. The value 0.75 µm is 0.3 times as large as the initial interval of the detection interval 40. It is preferable that the height of the protrusion 33 is a half or less of the initial interval of the detection interval 40 so that the protrusions 33 don't interfere with a displacement of the movable electrode member 24.

As shown in FIG. 1, stopper portions 26 are formed on the anchor portions 23a, 23b so as to be disposed in hollow portions formed in the rectangular frames provided by the pairs of the suspension members 22, and so as to protrude from the anchor portions 23a, 23b to the weight portion 21 in the sensor 100. The stopper portions 26 prevent the weight portion 21 from adhering to the anchor portions 23a, 23b. A distance between the stopper portions 26 and the weight portion is almost the same as the initial interval of the detection interval 40.

As shown in FIG. 2, fixed electrode pads 31b, 32b for wire bonding are formed on the conductive members 31a, 32a. A conductive member 25 for movable electrode 24 extends from the anchor portion 23b. A moving electrode pad 25a for wire bonding is formed on the conductive member 25. These pads 25a, 31b and 32b are made of aluminum, for instance.

As shown in FIGS. 2 and 3, a plurality of through holes 50 are formed in the weight portion 21, movable electrodes 24, fixed electrodes 31 and 32 through the second silicon substrate 12 from its main surface to its back surface facing the opening 13a of the oxide layer 13 so as to form the Rahmen structure (rigid frame structure). This structure is a series connection of a plurality of rectangular frames each of which surrounds the each of the through holes 50. The movable portion 20 and the fixed electrode members 31, 32 are constructed in light weight and high torsional rigidity by the Rahmen structure.

As shown in FIG. 3, the sensor 100 is glued to a package 70 with glue 60 at a back surface of the first silicon substrate 11, which is opposite to the main surface facing to the oxide layer 13. This package 70 accommodates a detection circuit 110 explained below, electrically connected to the pads 25a, 31b and 32b by wiring (not shown) made of aluminum, gold and the like.

In a sensor structure as described above, a first capacitance CS1 is formed between the moving electrodes 24 and the fixed electrodes 31, and a second capacitance CS2 is formed between the moving electrodes 24 and the fixed electrodes 32. When acceleration is applied to the sensor 100, these first and second capacitances CS1, CS2 change in accordance with a displacement of the movable electrode caused by resilience of the spring portions. The detection circuit 110 detects acceleration based on a change of a differential capacitance (CS1–CS2).

Figure 6:
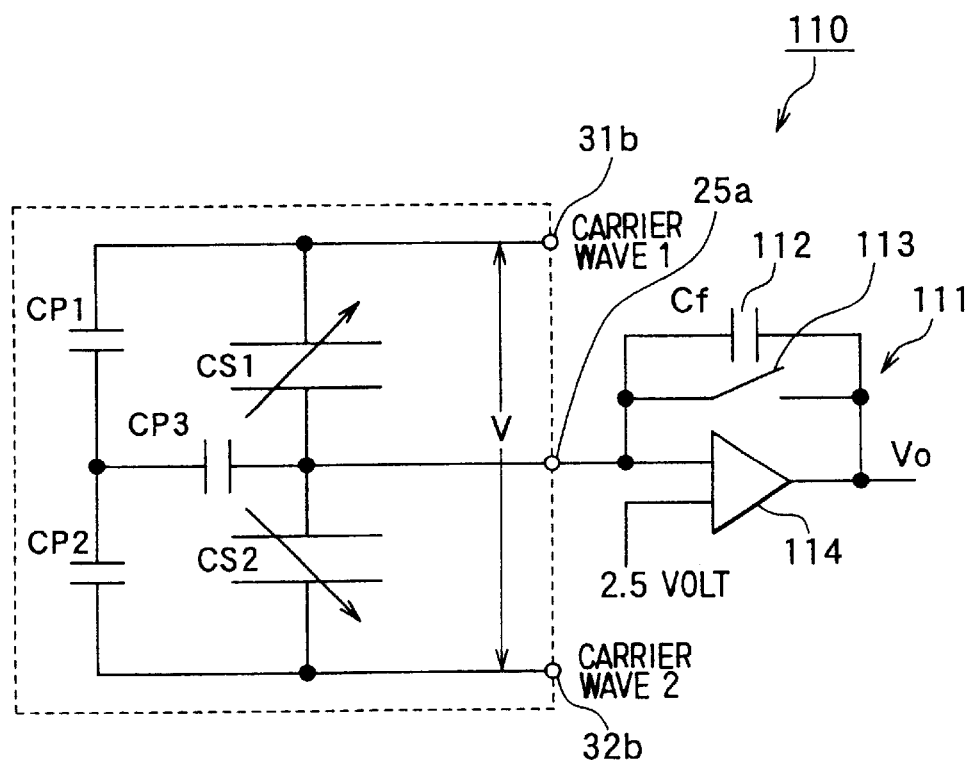
FIG. 6 is a schematic circuit diagram of a capacitance charge detection circuit.

A circuit diagram of the detection circuit 100 is shown in FIG. 6. A switched capacitor circuit 111 (SC circuit) is made up of a condenser 112 having a capacitance Cf, a switch 113 and a differential amplifier 114 connected as shown in the Figure, and converts the differential capacitance (CS1–CS2) to a voltage.

Each of CP1, CP2 and CP3 stands for a parasitic capacitance. CP1 is the parasitic capacitance formed between the supporting substrate 11 and the conductive member 31a. CP2 is the parasitic capacitance formed between the supporting substrate 11 and the conductive member 32a. CP3 is the parasitic capacitance formed between the supporting substrate 11 and the conductive member 25a.

Figure 7:
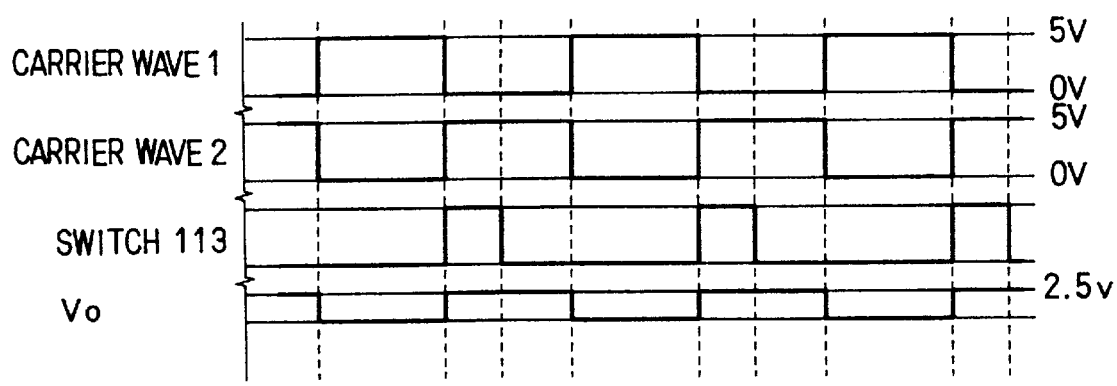
FIG. 7 is a chart of waveforms associated with the circuit.

A sample chart of waveforms associated with the detection circuit 110 is shown in FIG. 7. In the sensor 100 constructed as described above, a carrier wave signal 1 (frequency; for example, 100 kHz, an amplitude; for example, 0–5 V) composed of a rectangular wave of the kind shown in FIG. 7 is impressed on the fixed electrode 31 through the pad 31b and the conductive member 31a, and a carrier wave signal 2 (frequency; for example, 100 kHz, an amplitude; for example, 0–5 V) composed of a rectangular wave 180° out of phase with the carrier wave 1 is impressed on the fixed electrode 32 through the pad 32b and the conductive member 32a. The switch 113 is turned ON/OFF in accordance with a timing shown in FIG. 7. The acceleration applied to the sensor 100 is detected as a voltage Vo represented by the following equation.

$$V_o = \{(CS1-CS2)+(CP1-CP2)\cdot CP3\}\cdot V/Cf$$

Wherein, V stands for a difference voltage formed across the pads 31b and 32b.

As described above, it is a main feature in this embodiment that the protrusions 33 are formed on both the side faces of each the fixed electrodes 31, 32 facing the side faces of adjoining two of the movable electrodes 24. In other words, the protrusions 33 are disposed not only in the detection interval 40 but in the non-detection interval 41.

Therefore, in the sensor 100 having the non-symmetrical structure described above, in the event that a rotation of the weight portion 21 described above occurs when an excessively large acceleration is applied to the sensor 100, the protrusions 33 prevent the movable electrodes 24 from adhering to the fixed electrode 31 or 32.

In the detection interval 40 or the non-detection interval 41, the protrusions 33 don't adhere to the movable electrodes 24 because of the following reasons and the like in the event that the movable electrodes 24 touch to top portions of the protrusions 33.

First, the area of the top portion of the protrusion 33 is small in comparison with the area of the side face of the fixed electrodes 31 or 32. Second, in many cases an insulated oxide film may be formed on the top portions of protrusions 33 by oxidizing silicon. Third, the difference voltage formed between the movable electrode 24 and the fixed electrode 31 or 32 is not so large, and is, for example, 2.5 V.

As mentioned above, it is desirable that the height of the protrusions 33 is designated based on the relationship of the electrostatic attracting force Fe and the spring restoring force Fk. Shapes and disposed positions of the protrusion 33 disposed on the movable electrode opposing faces of the fixed electrodes 31, 32 have a lot of design choices. It is, however, necessary that each area of the top portions of the protrusions 33 must be small to prevent the protrusions 33 from adhering to the movable electrodes 24, scince the electrostatic attracting force is generated between the top portions of the protrusions 33 and the movable electrodes 24. For example, it is desirable that the each protrusion has a shape such as pyramid or corn so that the area of the top portion becomes small.

It is preferable that the protrusions 33 disposed on one and the other of the movable electrode opposing faces of each fixed electrode 31 or 32 are symmetrically with respect to the longitudinal direction of each the fixed electrode 31 or 32. In this case because the protrusions 33 are disposed regularly, they are formed easily by etching or the like. Furthermore, it is preferable that the protrusions 33 disposed on the one side face of the movable electrode opposing faces of each fixed electrode 31 or 32 have the same shape and the same size as the protrusions 33 disposed on the other side face of movable electrode opposing faces of each the fixed electrode 31 or 32. Accordingly, the protrusions 33 are formed uniformly.

Furthermore, in the sensor 100, each three (or more) protrusions 33 are disposed on both of the movable electrode opposing faces of each fixed electrode 31 or 32 with the intervals S1 and S2 interposed between two of the three protrusions 33. It is desirable that the interval S1 disposed on a tip portion of the fixed electrode 31 or 32 is smaller than the interval S2 disposed on a root portion of the fixed electrode 31 or 32.

In this manner, the protrusions 33 are disposed concentrated on the tip portion of the fixed electrode member 31 or 32. The tip portion of a beam-shaped electrode is easy to bend, and so the tip portion is easy to adhere to an opposite electrode. Therefore, it is an advantage in this embodiment that the protrusions are concentrated on the tip portion of the fixed electrode 31 or 32 to prevent adhesion.

In the sensor 100, stopper portions 26 formed on the anchor portions 23a, 23b prevent the anchor portions 23a, 23b from adhering to the weight portion 21. Furthermore, the stopper portions 26 prevent the protrusions 33 from colliding hard against the movable electrodes 24 because the interval between the stopper portions 26 and the weight portion 21 is almost equal to the initial interval between the top portion of the protrusion 33 and the movable electrode 24.

Figure 8:
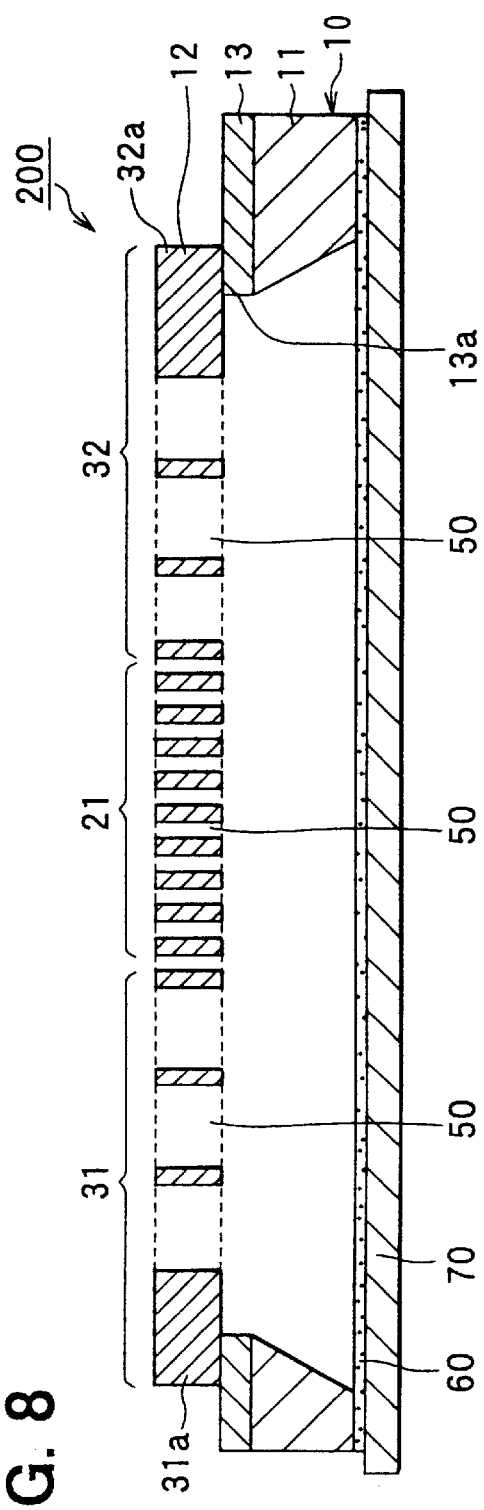
FIG. 8 is a sectional view of another semiconductor acceleration sensor of the first embodiment of the present invention.

A variation of this embodiment will be explained with reference to FIG. 8. A sectional view of a semiconductor acceleration sensor 200 is shown in FIG. 8. In the sensor 200, not only a part of the oxide film 13 corresponding to the opening 13a but a part of the first silicon substrate 11 facing the movable portion 20 and the fixed portion 30 is removed by anisotropic etching using etching solution (for example, KOH) from the back surface of the first silicon substrate 11. This part becomes a rectangular hollow portion of the first silicon substrate 11. The other structure is the same as the sensor 100 of the first embodiment.

(Second Embodiment)

Miniaturization is required for a semiconductor physical quantity detection sensor such as the sensor described in Prior Art and the sensor 100 described above.

For this purpose, it is a useful way to shorten the suspension members 22 in its longitudinal direction in the sensor in FIG. 2. However, the length of the suspension portion is very important because it is main factor of spring modulus that contributes to a sensitivity of the sensor. Therefore, it is not so easy to shorten the length of the suspension members 22.

To solve the new problem described above, it is conceivable to connect several rectangle frame spring portions, each of which is formed with one pair of the suspension members 22, in series in a direction along the axis Y1. In the direction corresponding to the axis Y1, the number of folding times of each rectangle frame spring portion is only one. Therefore, if two rectangle frame spring portions are connected in series, two folds are disposed in the direction corresponding to the axis Y1.

Figure 11:
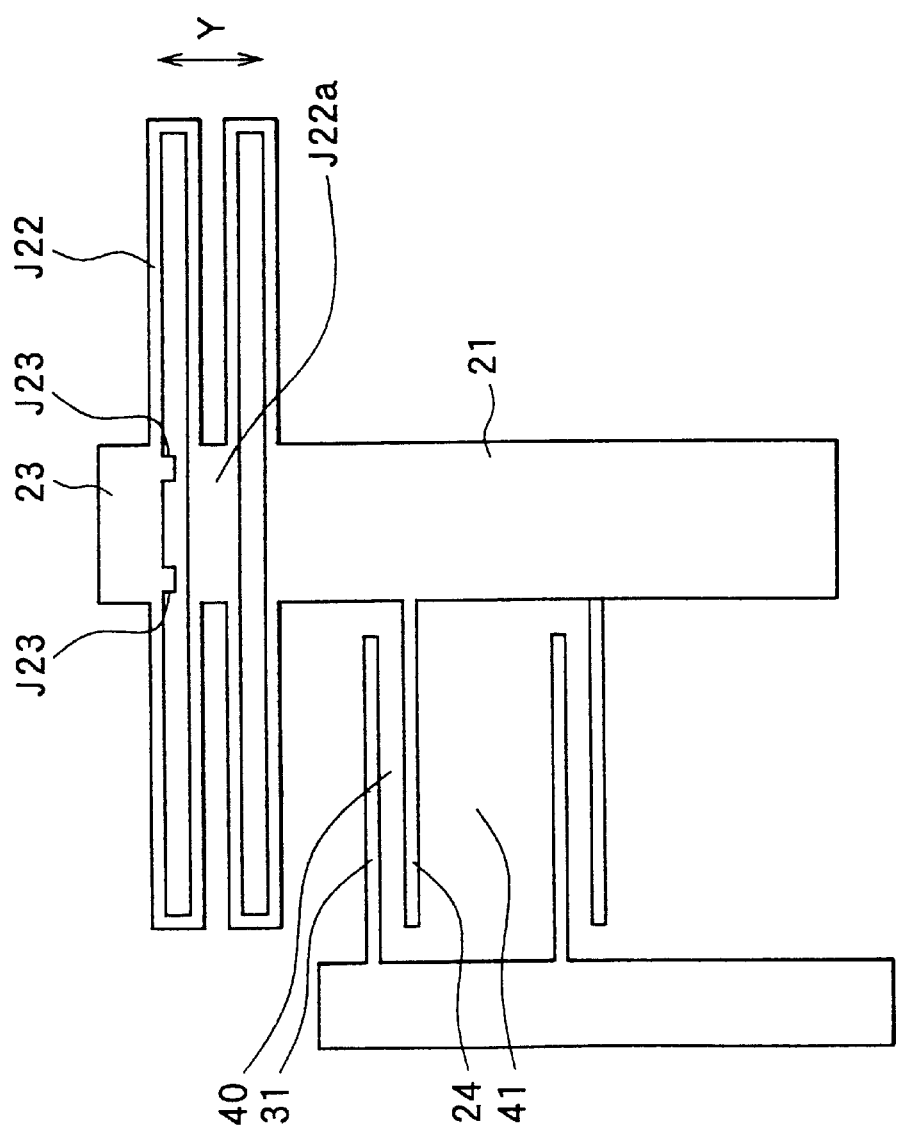
FIG. 11 is a plan view of a main part of a semiconductor acceleration sensor that the inventors of the present invention contrived.

In FIG. 11, a plan view of a main part of a semiconductor acceleration sensor having a spring portion J22 in which two rectangle frame spring portions are connected in series as described above. This sensor was manufactured as a prototype.

In FIG. 11, the anchor portion 23 is supported by the supporting structure (not shown), and the weight portion 21 is suspended with the anchor portion 23 though the spring portion J22. In FIG. 11, only one end portion around the weight portion 21 is only shown, but other structure not shown in FIG. 11 of the sensor is almost the same as the sensor 100 shown in FIG. 2.

The spring portion J22 is connected to the anchor portion 23 at its one end and to the weight portion 21 at the other end. The spring portion J22 has two folding-back portions in its middle part in the direction Y. This spring portion J22 can realize a preferable beam structure for achieving the miniaturization of the sensor.

In the sensor in which the beam structure has two folding-back portions as shown in FIG. 11, the inventors expected to prevent the movable electrode 24 from adhering to the fixed electrode 31 as the object of the invention in case that the weight portion 21 hits to the anchor portion 23 before the movable electrode 24 hits and adhere to the fixed electrode 31 caused by an excessively displacement of the weight portion 21.

In this case, a connecting member J22a of the spring portion J22 intervenes between first and second rectangle frames spring member because of connecting frame structure. Further, to prevent the movable electrode 24 from adhering to the fixed electrode 31, stoppers J23 are formed on the anchor portion 23 so as to protrude from the anchor portion 23 to the connecting member J22a.

However, the sensor having the structure described above has the following limitation. Specifically, it is established hypothetically that a detection interval 40 between the movable electrode 24 and the fixed electrode 31 is 8 (arbitrary unit), and a maximum amount of displacement of the weight portion 21 due to bending of the spring portion J22 is 10 when acceleration is applied to the sensor. In this case, an amount of displacement of the connecting member J22a is 5 that is a half of an amount of displacement of the weight portion 21.

Therefore, in the case that an interval between the stoppers J23 and the connecting member J22a is set to be 7, the movable electrode member 24 would hit against the fixed electrode member 31 before the connecting member J22a would hit against the stoppers J23 because the connecting member J22a can move only by 5 due to the above mentioned reason.

After all, in the sensor in which the beam structure has the two folding-back portions as shown in FIG. 11, it is needed that the interval between the stoppers J23 and the connecting member J22a is formed a half or less of the detection interval 40 to prevent a movable electrode 24 from adhering to a fixed electrode 31. Similarly, when the number of rectangle frame spring members connected in series is n, it is needed that the interval between the stoppers J23 and the connecting member J22a is set to be a one-nth or less of the detection interval 40.

Since the detection interval is usually formed as narrow as possible under the limit of manufacturing accuracy, it is difficult to form the interval between the stoppers J23 and the connecting member J22a to be a half or less of the detection interval 40 under the limit of manufacturing accuracy. To the contrary, the increase of the detection interval 40 causes a demerit like as a deterioration of sensitivity.

By the way, JP-A-11-344507 discloses a semiconductor acceleration sensor having a similar spring structure as described above as shown in FIG. 11. In the sensor described in this reference, a stopper is formed inside of the weight portion. However, in this stopper structure, the stopper must be fixed to a supporting substrate under the weight portion.

It is an object of the second embodiment to let an anchor portion work as a stopper to prevent a movable electrode from adhering to a fixed electrode, in a structure in which a weight portion is suspended through a suspension portion having a lot of folding-back portions in a direction that the weight portion moves.

Figure 9:
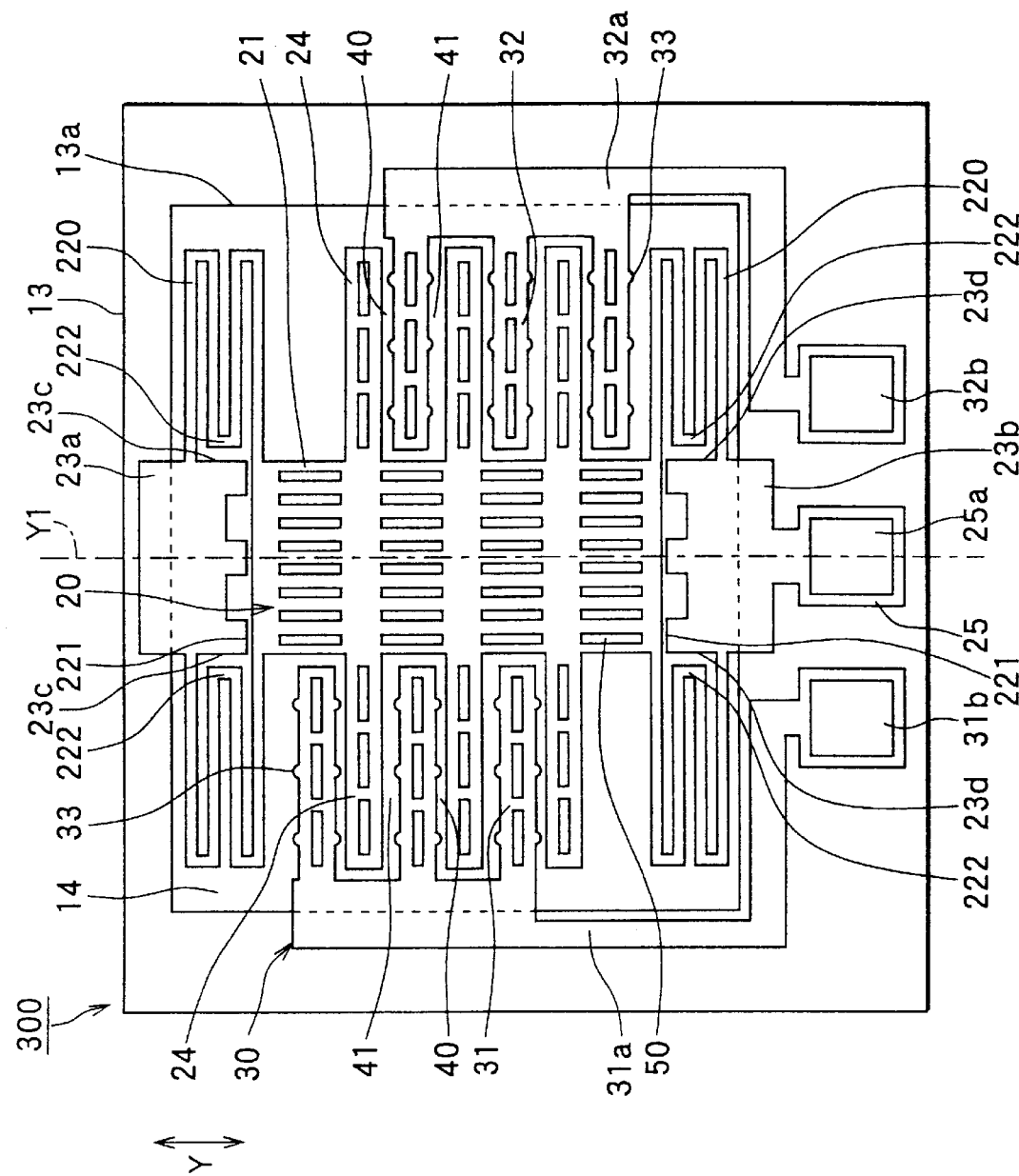
FIG. 9 is a plan view of a semiconductor acceleration sensor of a second embodiment of the present invention.

Referring to FIG. 9, the sensor 300 is modified from the sensor 100 or 200 at suspension portion and its peripheral portion, and so the difference structure will be explained mainly hereinafter. In this embodiment, like numerals refer to like parts of the sensor 100 shown in FIG. 2.

Similarly to the first and second embodiments described above, the sensor 300 also has the anchor portions 23a, 23b supported with the first silicon substrate 11 (supporting substrate) at outer portions of both ends of the weight portion 21 in the direction corresponding to the axis Y1. The weight portion 21 is connected to the anchor portions 23a, 23b though suspension portions 220 having a spring function which enables the weight portion 21 to move in a displacement direction (arrow Y direction, hereinafter, it is referred to as a displacement direction Y). The specific structure of this embodiment will be described as follows.

The both ends of the weight portion 21 in the displacement direction Y face to the anchor portions 23a, 23b with an interval which is narrower than the interval between the movable electrode 24 and the fixed electrode 31 or 32 (in this embodiment, the interval between the protrusions 33 and the movable electrode 24).

An end of each suspension portion 220 is connected to the anchor portion 23a or 23b, and the other end is connected to the weight portion 21. In addition, each middle part of the suspension portion 220 has a beam structure folded many times at outer portions along the displacement direction Y of anchor portion 23a or 23b.

As shown in FIG. 9, in this embodiment, the anchor portions 23a, 23b extend toward the weight portion 21 along the displacement direction Y so as to face to the weight portion 21. Each of the suspension portions 220 is disposed outside of the anchor portion 23a or 23b in a direction perpendicular to the displacement direction Y and folded back many times (three times in this embodiment).

In other words, each suspension portion 220 has one pair of suspension member like an accordion spring. Each suspension member has four bending segments (members), two outer folds and one inner fold numbered 222 in this embodiment. The inner fold 222 faces to the side face of the anchor portion along the displacement direction Y. Each fold connects two of the bending segments.

In the specific structure of this embodiment, facing portions of the anchor portions 23a, 23b opposing the weight portion 21 work as a stopper portions. In this embodiment as shown in FIG. 9, the anchor portions 23a, 23b respectively has stopper members 221 that protrude from the anchor portions 23a, 23b to the weight portion 21 at the facing portions.

In the sensor 300 shown in FIG. 9, an amount of displacement of the inner fold 222 is about a half of a whole amount of displacement of the suspension portion 220, i.e., the weight portion 21.

In this embodiment, both ends of the weight portion 21 in the displacement direction Y face to the anchor portions 23a, 23b with interval which is narrower than the interval between the movable electrode 24 and the fixed electrode 31 or 32. Therefore, the weight portion 21 hits against the stopper members 221 before the movable electrode member 24 hits against the fixed electrode member 31 or 32 because of an excessively displacement of the weight portion 21.

After all, in this embodiment, the anchor portions 23a, 23b, the stopper members 220 are modified from the anchor 23 and stoppers J23 shown in FIG. 11 so as to have the stopper members 221 work to prevent the movable electrodes 24 from adhering to the fixed electrode 31 or 32 positively.

A distance to hit the stopper members 221 against the weight portion 21 (a collision distance between weight portion and anchor portion) doesn't depend on the numbers of folding times of the suspension members 220 in the displacement direction Y because stopper members 221 (the anchor portions 23a, 23b) extend and face directly to the weight portion 21.

Although the interval between the stopper members 221 and the weight portion 21 is formed narrower than the detection interval between the movable electrode 24 and the fixed electrode 31 or 32 in this embodiment, it isn't required to make the interval narrower extremely as in the case that the collision distance between the weight portion and the anchor portion depends on the number of folding times as shown in FIG. 11.

Therefore, the sensor 300 can be provided with the anchor portions 23a, 23b and stopper members 221 that work as a stopper for preventing the movable electrode member 24 from adhering to the fixed electrode member 31 or 32 without requiring rigorous processing accuracy.

After all, according to the sensor 300 of this embodiment, it is achieved in higher level to prevent the movable electrode member 24 from adhering to the fixed electrode member 31 or 32, since the weight portion 21 can hit to the stopper members 221 before the movable electrode 24 hits to the fixed electrode 31 or 32 due to an excessively displacement of the weight portion 21.

According to this embodiment, a contact area between the anchor portions 23a, 23b and weight portion 21 can be reduced at the facing portions of the anchor portions 23a, 23b opposing the weight portion 21, since the stopper members 221 are formed on the anchor portions 23a, 23b.

Of course, it doesn't need necessarily to make the stopper members 221 protruded from the anchor portions 23a, 23b. When the anchor portions 23a, 23b have no stopper members, each of the anchor portions 23a, 23b is regarded as a stopper at an entire width thereof, and it improves strength of the stopper in comparison with that having the fine stopper members 221.

Therefore, when an excessively large acceleration is applied to the sensor 300, a displacement of the weight portion 21 is restricted stably because a crash of the stopper due to the excessively large acceleration is decreased by using the anchor portions 23a, 23b as the stopper and by dispensing with the fine stopper members. However, the weight portion 21 may easily adhere to the anchor portion 23a or 23b due to an increase of the contact area in comparison with the case that the stopper members 221 protruding from the anchor portions 23a, 23b are used as the stopper.

In the case that the anchor portions 23a, 23b have no stopper member 22, it is preferable that side faces opposing each other of the weight portion 21 and each of the anchor portions 23a, 23b are formed in non-parallel with each other in a direction of a thickness of the second silicon substrate 12, since the contacting area between the weight portion 21 and anchor portion 23a or 23b is reduced due to the non-parallel side faces. The non-parallel faces can be made when a interval between the weight portion 21 and the anchor portion 23a or 23b is smaller than the detection interval 40 between the movable electrode 24 and the fixed electrode member 31 or 32, and when a width of a trench between the movable electrode 24 and the fixed electrode 31 or 32 is finest to make side faces opposing each other of the movable electrode 24 and the fixed electrode 31 or 32 parallel with each other.

Figure 10:
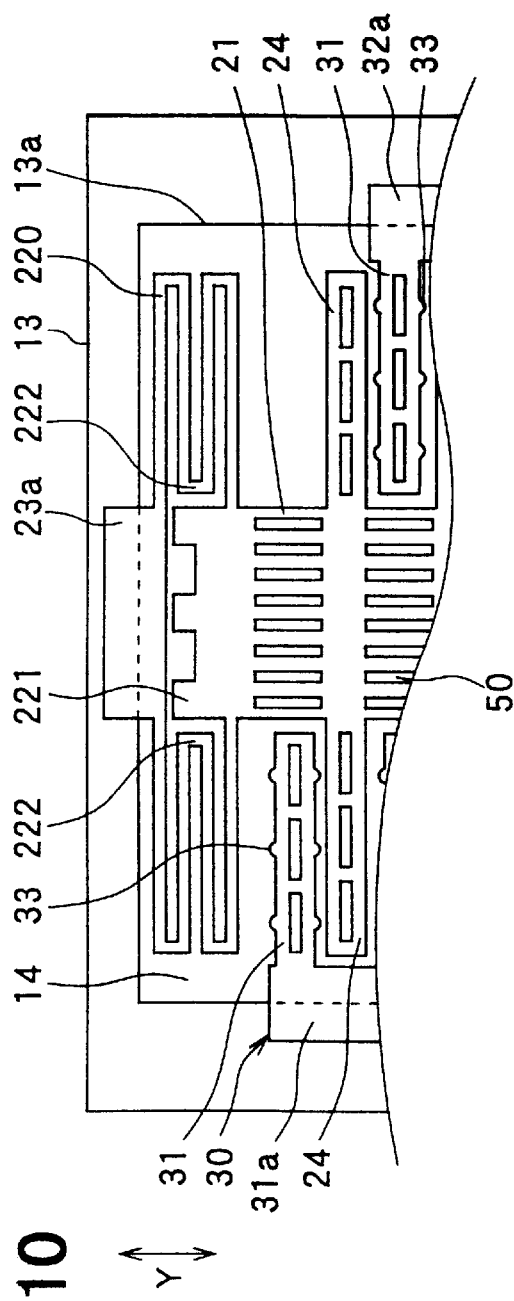
FIG. 10 is a part of a plan view of another semiconductor acceleration sensor of the second embodiment of the present invention.

An alternative sensor of the second embodiment is shown in FIG. 10. Unlike the sensor 300 in FIG. 9, in the sensor in FIG. 10, the weight portion 21 is extended to the anchor portions 23a, 23b so as to traverse in side portion of the suspension portions 220 (so that the inner folds 222 of the suspension members 220 face to the weight portion 21 along the displacement direction Y).

In this embodiment, the weight portion 21 has stopper members 221 on facing portions of the weight portion 21 opposing to the anchor portions 23a, 23b. It is clear that this alternative sensor shown in FIG. 10 has the same advantages of the sensor 300 of the second embodiment as described above.

(Third Embodiment)

Figure 12:
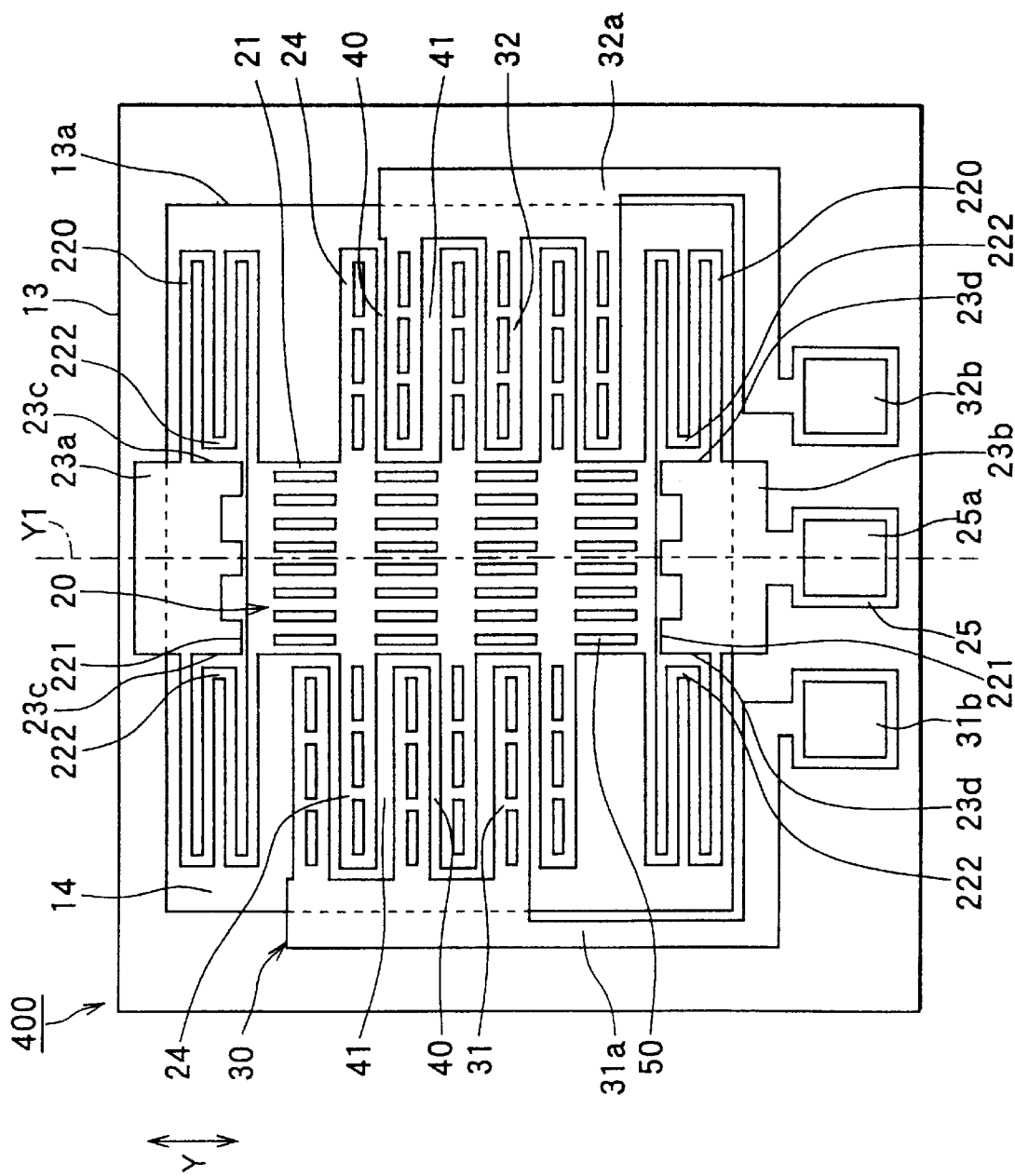
FIG. 12 is a plan view of a semiconductor acceleration sensor of a third embodiment of the present invention.

Referring to FIG. 12, a sensor 400 in this embodiment is the same as the sensor 300 in the second embodiment except that the protrusions 33 are not formed on the fixed electrodes 31 and 32 in the sensor 400.

A sensor 400 has a movable portion 20 and a fixed portion 30 on a first silicon substrate 11 (supporting substrate). The movable portion 20 has a weight portion 21 that is movable along a displacement direction Y due to an acceleration applied to the sensor, and comb-shaped movable electrodes 24 formed on both side surfaces of the weight portion 21 centering an axis Y1 in accordance with a displacement direction. The fixed portion 30 has fixed electrodes 31 and 32 each electrode members of which engaging with each of the movable electrodes 24 so as to oppose to the movable electrodes 24. This sensor 400 detects an acceleration applied to the sensor in the displacement direction Y based on a change of capacitance provided with the movable electrodes 24 and the fixed electrodes 31, 32.

As shown in FIG. 12, the weight portion 21 is suppressed with anchor portions 23a, 23b though suspension portions 220 having many folding-back portions structure. The suspension portions 220, the anchor portions 23a, 23b of the sensor 400 in this embodiment are formed substantially the same as those of the sensor 300 described in the second embodiment shown in FIG. 9.

Each of the anchor portions 23a, 23b each has stopper members 221 protruding to the weight portion 21. An interval between the stopper portions 221 and the weight portion 21 is smaller than that between the movable electrodes 24 and the fixed electrodes 31, 32.

According to the sensor 300 described in the second embodiment, it is achieved in higher level to prevent the movable electrode 24 from adhering to the fixed electrode 31 or 32 because of the protrusions 33 formed on the fixed electrodes 31, 32 the suspension members 220.

But, it is also achieved that the weight portion 21 hits against the stopper members 221 of the anchor portion 23a or 23b before the movable electrode 24 hits against the fixed electrode 31 or 32 only with the suspension portions 220 and those peripheral portion shown in FIG. 9.

After all, as the sensor 400 according to this embodiment, it is achieved sufficiently to prevent the movable electrode 24 and from adhering to the fixed electrode 31 or 32 even if the protrusions 33 are not formed on the fixed electrodes 31, 32. Furthermore, it is needless to say to achieve the beam structure suitable for miniaturization in size of the sensor in this embodiment.

(Alternate of the embodiments)

The protrusions 33 are not formed only on the fixed electrodes 31 and 32. The protrusions 33 may be formed only on the movable electrodes 24 or formed on both the fixed electrode 31 (32) and the movable electrode 24. Any other alternative is applied to the sensor described above. In these cases, the same structure described above are applied and the same advantages are obtained.

Furthermore, the invented structure described above is applied to any other capacitance-detecting type sensor that has the non-symmetrical structure, for example, a pressure sensor, angular velocity sensor and the like.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor physical quantity sensor comprising:
   a supporting substrate;
   a movable portion supported on the supporting substrate and having a weight portion movable in a displacement direction, and first movable electrodes and second movable electrodes provided on both sides of the weight portion and protruding from the weight portion perpendicularly to the displacement direction;
   a fixed portion provided on the supporting substrate and electrically divided from the moving portion by a trench, the fixed portion having first fixed electrodes and second fixed electrodes respectively protruding toward the movable portion and extending in parallel with the first movable electrodes and second movable electrodes and defining first detection intervals and second detection intervals at the both sides of the weight portion;
   wherein an applied physical quantity is detected based on changes in capacitances generated between the first movable electrodes and the first fixed electrodes, and between the second movable electrodes and the second fixed electrodes when the first movable electrodes and the second movable electrodes move responsive to the applied physical quantity;
   wherein an electrostatic attracting force generated between the first movable electrodes and the first fixed electrodes acts in a direction opposite to that in which an electrostatic attracting force generated between the second movable electrodes and the second fixed electrodes acts;
   wherein the first movable electrodes or the first fixed electrodes have protrusions protruding in parallel with the displacement direction from opposing side faces of the first movable electrodes or the first fixed electrodes, and facing in the displacement direction of the movable portion to define the first detection intervals interposed therebetween.

2. A semiconductor physical quantity sensor according to claim 1, wherein the first movable electrodes and the first fixed electrodes include other side faces opposing each other, wherein the other side faces define first non-detection intervals that are larger than the first detection intervals.

3. A semiconductor physical quantity sensor according to claim 1, wherein the second movable electrodes or the second fixed electrodes have protrusions protruding from opposing side faces, the opposing side faces facing in the displacement direction of the movable portion and defining the second intervals interposed therebetween, and the second movable electrodes and the second fixed electrodes include other side faces opposing each other, wherein the other side faces defining second non-detection intervals that are larger than the second detection intervals.

4. A semiconductor physical quantity sensor according to claim 1, wherein the first movable electrodes or the first fixed electrodes have other protrusions protruding in parallel with the displacement direction from the other side faces, the protrusions protruding from the opposing side faces and the other side faces are disposed symmetrically each other with respect to a longitudinal direction of the first movable electrodes or the first fixed electrodes having the protrusions.

5. A semiconductor physical quantity sensor according to claim 1, wherein the first movable electrodes or the first fixed electrodes have other protrusions protruding in parallel with the displacement direction from the other side faces, all of the protrusions being formed on the opposing side faces and on the other side faces to have an identical size and an identical shape.

6. A semiconductor physical quantity sensor according to claim 1, wherein the protrusions include at least three protrusions that are arranged along a longitudinal direction of the first movable electrodes or the first fixed electrodes on which the at least three protrusions are disposed;

wherein an interval between two of the at least three protrusions disposed on a tip portion of the first movable electrodes or the first fixed electrodes on which the at least three protrusions are disposed is smaller than that between two of the at least three protrusions disposed on a root portion of the first movable electrodes or the first fixed electrodes on which the at least three protrusions are disposed.

7. A semiconductor physical quantity sensor according to claim 1, further comprising:

anchor portions disposed in the displacement direction of the weight portion for anchoring end portions that are positioned at both sides in the displacement direction of the weight portion;

suspension portions each connected to respective ones of the anchor portions and suspending the weight portion at the end portions of the weight portion in the displacement direction, each suspension portion having a spring function which enables the weight portion to move along the displacement direction;

wherein intervals from each of the end portions to each of the anchor portions are narrower than the first detection intervals disposed between the first movable electrodes and the first fixed electrodes;

wherein a middle part of each suspension portion is folded a plurality of times to have a plurality of folded-back portions at the outside of the weight portion or the anchor portions with respect to the displacement direction;

wherein each of the anchor portions has a portion opposed to the weight portion directly; and said portion works as a stopper to prevent an excessive displacement of the weight portion.

8. A semiconductor physical quantity sensor according to claim 7, wherein each of the suspension portions has suspension members folded a plurality of times in a direction perpendicular to the displacement direction so as to form a plurality of bending members and at least two resilient folds like an accordion spring;

wherein stopper members are formed on one of the anchor portions and the weight portion to restrict a displacement of the weight portion when an excessively large physical quantity is applied to the weight portion;

wherein the two resilient folds are disposed along a direction perpendicular to the displacement direction so that the one of the at least two resilient folds is disposed away from one of the stopper members and another one of the at least two resilient folds is disposed near the one of the stopper members.

9. A semiconductor physical quantity sensor comprising:

a supporting substrate;

a movable portion supported on the supporting substrate and having a weight portion movable in a displacement direction, and first movable electrodes and second movable electrodes provided on both sides of the weight portion and protruding from the weight portion perpendicularly to the displacement direction;

a fixed portion provided on the supporting substrate and electrically divided from the moving portion by a trench, the fixed portion having first fixed electrodes and second fixed electrodes respectively protruding toward the movable portion and extending in parallel with the first movable electrodes and second movable electrodes and defining first and second detection intervals at the both sides of the weight portion;

wherein an applied physical quantity is detected based on changes in capacitances generated between the first movable electrodes and the first fixed electrodes and between second movable electrodes and the second fixed electrodes when the first movable electrodes and second movable electrodes move responsive to the applied physical quantity;

wherein an electrostatic attracting forces generated between the first movable electrodes and the first fixed electrodes act in a direction opposite to that in which electrostatic attracting forces generated between the second movable electrodes and the second fixed electrodes act;

wherein:

the first movable electrodes are composed of a plurality of movable electrode members;

the first fixed electrodes are composed of a plurality of fixed electrode members opposing the plurality of movable electrode members, the plurality of fixed electrode members define the first detection intervals with the plurality of movable electrode members and define non-detection intervals with the plurality of movable electrode members, whereby the plurality of movable electrode members are disposed with the plurality of fixed electrode members interposed therebetween;

the plurality of fixed electrode members or the plurality of movable electrode members have respective first protrusions protruding in the first detection interval; and the plurality of fixed electrode members or the plurality of movable electrode members have respective second protrusions protrusion providing in the non-detection interval.

10. A semiconductor physical quantity sensor comprising:

a supporting substrate;

a movable portion having a weight portion and movable electrode members provided on both sides of the weight portion, the weight portion including side portions positioned in a displacement direction thereof;

a fixed portion electrically divided from the moving portion, the fixed portion having fixed electrode members each opposing each of the movable electrode members to form capacitors;

anchor portions disposed in the displacement direction of the weight portion for anchoring end portions of the weight portion;

suspension portions each connected to respective ones of the anchor portions and suspending the weight portion at the end portions of the weight portion in the displacement direction, each suspension portion having a spring function which enables the weight portion to move along the displacement direction;

wherein the end portions of the weight portion along the displacement direction face to the anchor portions with intervals narrower than first detection intervals disposed between the first movable electrodes and the first fixed electrodes;

wherein a middle part of each suspension portion is folded a plurality of times to have a plurality of folded-back portions at the outside of the weight portion or the anchor portions with respect to the displacement direction;

wherein each of the anchor portions has a portion opposed to the weight portion directly; and said portion works as a stopper to prevent an excessive displacement of the weight portion.

11. A semiconductor physical quantity sensor according to claim 10, wherein each of the suspension portions has suspension members folded a plurality of times in a direction perpendicular to the displacement direction so as to form plurality of bending members and at least two resilient folds like an accordion spring;

wherein stopper members are formed on one of the anchor portions and the weight portion to restrict a displacement of the weight portion when an excessively large physical quantity is applied to the weight portion;

wherein the two resilient folds are disposed along a direction perpendicular to the displacement direction so that the one of the at least two resilient folds is disposed away from one of the stopper members and another one of the at least two resilient folds is disposed near the one of the stopper members.

12. A semiconductor physical quantity sensor according to claim 10, wherein the weight portion or the anchor portions have protrusions on side faces thereof so as to protrude from the weight portion or the anchor portions to another one of the weight portion or the anchor portions.

13. A semiconductor physical quantity sensor comprising:

a supporting substrate;

a movable portion disposed on the supporting substrate and movable in a displacement direction, the movable portion having a weight portion, and first movable electrodes and second movable electrodes protruding from first and second sides of the weight portion and extending perpendicularly to the displacement direction;

first fixed electrodes and second fixed electrodes fixed on the supporting substrate, electrically isolated from the movable portion, and extending in parallel with the first movable electrodes to interpose each of the first movable electrodes between each of the first fixed electrodes and each of the second fixed electrodes, the first fixed electrodes define detection intervals with the first movable electrodes to form first capacitances that are changed when a physical quantity is applied to the weight portion, the second fixed electrodes define non-detection intervals with the first movable;

third fixed electrodes and fourth fixed electrodes fixed on the supporting substrate, electrically isolated from the movable portion, and extending in parallel with the second movable electrode to interpose each of the second movable electrodes between each of the third fixed electrodes and each of the fourth fixed electrodes, the third fixed electrodes define detection intervals with the second movable electrodes to form second capacitances that are changed in an opposite direction of the first capacitances when the physical quantity is applied to the weight portion; and first and second stoppers respectively provided in the detection intervals between the first fixed electrodes and the first movable electrodes and in the non-detection electrodes between the second fixed electrodes and the first movable electrodes, for preventing the first movable electrodes from contacting the first electrodes or the second fixed electrodes, wherein:

each of the first and second stoppers is a protrusion protruding from one of the first fixed electrodes and the second fixed electrodes and the first movable electrodes.

14. The semiconductor physical quantity sensor according to claim 13, wherein the first movable electrodes have first and second protrusions as the first and second stoppers respectively protruding from side faces of the first movable electrodes to face the first fixed electrodes and the second fixed electrodes.

15. The semiconductor physical quantity sensor according to claim 14, wherein the first and second protrusions provided on the side faces of the first movable electrodes are formed to have an identical shape and an identical size with each other.

16. The semiconductor physical quantity sensor according to claim 14, wherein one of the side faces of the first movable electrodes has at least three protrusions as one of the first and second stoppers, the three protrusions are arranged with a first interval at a tip portion of the first movable electrode and a second interval at a root portion of the first movable electrode, the first interval is smaller than the second interval.

17. The semiconductor physical quantity sensor according to claim 13, wherein the first fixed electrodes and the second fixed electrodes respectively have protrusions protruding toward the first movable electrodes.

* * * * *